United States Patent

Tuttle et al.

[11] Patent Number: 5,591,680
[45] Date of Patent: Jan. 7, 1997

[54] FORMATION METHODS OF OPAQUE OR TRANSLUCENT FILMS

[75] Inventors: Mark E. Tuttle, Boise; Rickie C. Lake, Eagle, both of Id.

[73] Assignee: Micron Communications, Boise, Id.

[21] Appl. No.: 294,126

[22] Filed: Aug. 22, 1994

Related U.S. Application Data

[62] Division of Ser. No. 164,161, Dec. 6, 1993, abandoned.

[51] Int. Cl.$^6$ .................. H01L 21/316; C23C 14/10; G02F 1/1333
[52] U.S. Cl. .................. 437/238; 437/241; 204/192.23; 204/192.25; 349/124; 349/138
[58] Field of Search .................. 437/235, 238, 437/241, 242, 28, 40, 41, 50, 51; 204/192.23, 192.25, 192.26, 192.27, 192.28; 359/76, 79

[56] References Cited

U.S. PATENT DOCUMENTS

| | | | |
|---|---|---|---|
| 3,650,815 | 3/1972 | Ghoshtagore et al. | 117/106 |
| 4,219,360 | 8/1980 | Thompson | 106/45 |
| 4,274,879 | 6/1981 | Irvine | 106/39.5 |
| 4,540,914 | 9/1985 | Maple | 313/466 |
| 4,587,138 | 5/1986 | Yau et al. | 427/88 |
| 4,780,326 | 10/1988 | Stemmer et al. | 426/125 |
| 4,948,482 | 8/1990 | Kobayashi et al. | 204/192.23 |
| 5,030,669 | 7/1991 | Hendrickson et al. | 523/333 |
| 5,038,186 | 8/1991 | Nishioka et al. | 357/17 |
| 5,100,503 | 3/1992 | Allman et al. | 156/643 |
| 5,145,723 | 9/1992 | Balance et al. | 427/397.7 |
| 5,258,334 | 11/1993 | Lantz, II | 437/238 |
| 5,319,491 | 6/1994 | Selbrede | 359/291 |
| 5,356,673 | 10/1994 | Schmitt et al. | 427/446 |
| 5,397,729 | 3/1995 | Kayanuma et al. | 437/52 |
| 5,399,441 | 3/1995 | Bearinger et al. | 428/689 |
| 5,470,398 | 11/1995 | Shibuya et al. | 148/33.3 |
| 5,486,712 | 1/1996 | Arima | 257/296 |
| 5,486,713 | 1/1996 | Koyama | 257/310 |

FOREIGN PATENT DOCUMENTS

| | | | |
|---|---|---|---|
| 61-273549 | 12/1986 | Japan | G03G 5/08 |
| 63-025629 | 8/1989 | Japan . | |

OTHER PUBLICATIONS

'Hawley's Condensed Chemical Dictionary', 11th Ed. Van Nostrand Reinhord Co., New York 1987, p. 160.
'Polymer Field Stop for Electroptic Device', p. 935 IBM Tech. Disclosure Bulletin, vol. 17, No. 3, Aug. 1974.

*Primary Examiner*—John Niebling
*Assistant Examiner*—Matthew Whipple
*Attorney, Agent, or Firm*—David J. Paul

[57] ABSTRACT

The present invention develops an opaque or translucent glass film for use in semiconductor fabrication processes, such as in EPROMs or radio frequency integrated circuits. The opaque or translucent film is developed by forming an glass layer while and introducing a light blocking pigment into the glass layer. The light blocking pigment is made up of a metal oxide, such as titanium oxide ($TiO_2$), an organic dye, bone ash, or dispersed metal particles. The glass layer is made up of spin on glass.

7 Claims, 1 Drawing Sheet

FORMATION METHODS OF OPAQUE OR TRANSLUCENT FILMS

CROSS-REFERENCE TO RELATED APPLICATION

This is a divisional to U.S. patent application Ser. No.08/164,161 filed Dec. 6, 1993, now abandoned.

FIELD OF THE INVENTION

This invention relates to semiconductor technology, and more specifically, to insulating opaque or translucent films used in semiconductor and flat panel display fabrication processes and methods to form the same.

BACKGROUND OF THE INVENTION

It is very difficult to find thin films which are opaque (or translucent) to visible and ultraviolet light, insulating, non-ionic, tolerant to high temperature processing, nonmetallic and compatible with integrated circuit processing. Using a metal layer as an opaque layer is not optimum because the processing becomes more costly and complicated. The use of metal requires an additional mask step in order to avoid shorting a semiconductor's pads together during assembly and cannot be used in processes that require temperatures above 450° C. Using metal also adds capacitive coupling to the integrated circuit that is significant and undesirable. In addition, the use of metal will effectively shield radio frequency transmissions from the I.C. This is deleterious for an Radio Frequency Integrated Circuit (RFIC) with on-chip antennas.

Standard integrated circuits require an ultraviolet light blocking material to function properly, which standard encapsulation normally provides. For novel packages that allow light into portions of the package it is necessary to block out light to an integrated circuit over the entire chip with the exception of a photocell area or photo detector area. Electron-hole pairs are generated by incoming light and this interferes with the normal function of transistors and other light sensitive circuit elements designed to operate in darkness. An ideal material for accomplishing this task would be a non-conducting opaque material that would avoid requiring another mask which increases production costs and processing complexity.

SUMMARY OF THE INVENTION

A main focus of the present invention is to form an insulating opaque or translucent film to visible and ultraviolet light, for use in semiconductor fabrication.

In a general aspect, the present invention develops an opaque film for use in semiconductor and flat panel display fabrication processes by forming an insulating layer while simultaneously introducing a light blocking pigment into the insulating layer.

DETAILED DESCRIPTION OF THE INVENTION

The present invention comprises two methods of opaque layer formation that can be performed either before or after metallization of an integrated circuit. For example, ultraviolet erasable EPROMs, photovoltaic cells with adjacent IC circuitry, and in particular flat panel displays can use the opaque layer to protect light sensitive circuits.

A first method comprises the incorporation of a pigment into an insulating layer during chemical vapor deposition (CVD), sputtering, or other techniques used to form the insulating layer. An example of this method would be a plasma enhanced chemical vapor deposition (PECVD) of $SiO_2$ with a dopant level from 1% to 50% of $TiO_2$. A plasma reaction of $SiH_4$, $O_2$, and $TiCl_4$, at about 400° C., will produce an insulating layer of $SiO_2$ that contains a light blocking pigment. A second example to produce a pigmented (or opaque) insulating film would be to co-sputter SiN and/or $SiO_2$ along with a metal oxide, such as $TiO_2$, $CeO_2$, $Al_2O_3$, and the like.

A second method comprises the incorporation of a pigment into a layer of spin on glass (SOG), such as an SOG manufactured by Allied Corporation, Milpitas, Calif. The pigments may be incorporated in the SOG material or be added during the SOG application to the substrate. During the process of spinning on a layer of glass over a supporting substrate (such as a silicon wafer) pigments are introduced into the SOG by such means as introducing a dopant such as $TiO_2$, or by introducing organic dyes or bone ash, or other pigments (e.g., metal particles such as silicon particles, Al particles and the like). The SOG is then spun onto the supporting substrate and cured, thereby automatically containing the previously introduced pigment(s). This method would allow layers up to a micron thick to be formed. If thicker layers are needed, multiple applications of a pigment laced SOG can be used.

Figure 1:
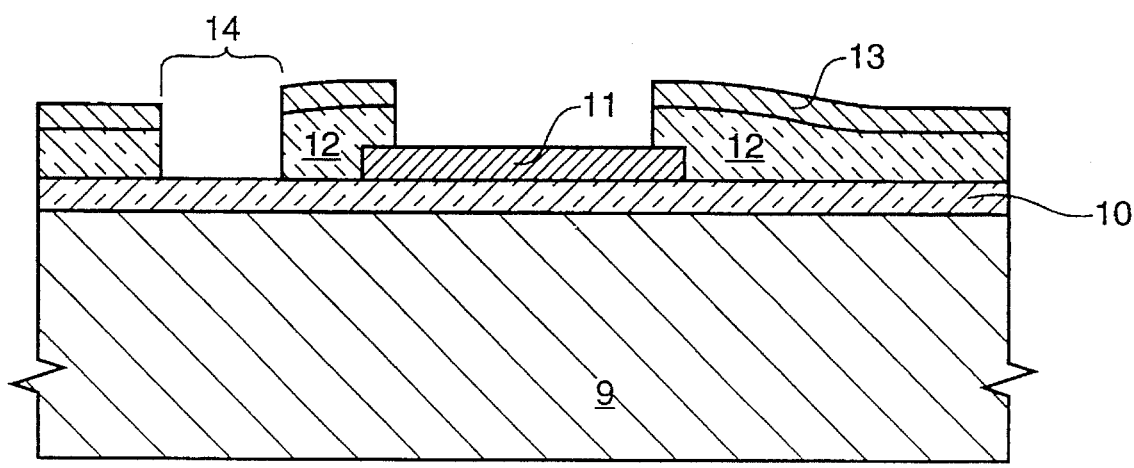
FIG. 1 depicts a cross-section through an IC bond pad with the opaque layer patterned simultaneously with the IC passivation opening.

FIG. 1 demonstrates a specific application using an opaque layer as described in the preceding embodiments. Referring now to FIG. 1, a starting substrate 9 has borophosphosilicate glass (BPSG) 10 and a metal bond pad 11 formed thereon. Passivation layer 12 (such as silicon dioxide and/or silicon nitride) is placed over substrate 9, BPSG 10 and metal bond pad 11. Next an opaque (or light blocking) layer 13 is formed over passivation layer 12. Then opaque layer 13 is patterned so that a following etch will form an opening at location 14 in the opaque layer while exposing underlying metal bond pad 11. Opening location 14 is formed when a window is required for light sensitive devices are to be exposed to incoming light (e.g. EPROM memory arrays or photo detectors). The underlying passivation layer 12 is simultaneously removed during the removal of the patterned portion of opaque layer 13.

Figure 2:
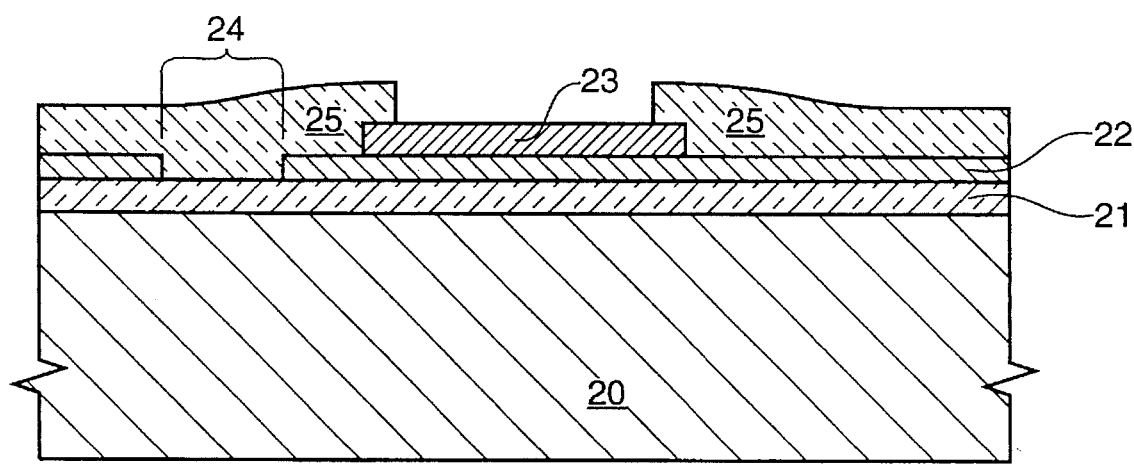
FIG. 2 depicts a cross-section through an IC bond pad with the opaque layer under the metal and patterned separately from the metal or passivation.

FIG. 2 demonstrates another specific application using an opaque layer as described in the preceding embodiments. Referring now to FIG. 2, a starting substrate 20 has an interlayer dielectric 21, such as borophosphosilicate glass (BPSG), formed thereon. Light blocking layer 22 (opaque) is formed over interlayer 21. Next, opening 24 is formed in opaque layer 22 by standard photolithographic and etch techniques, if a window is required for light sensitive devices that are to be exposed to incoming light (e.g. EPROMs). A metal bond pad 23 is formed over opaque layer 22, which is followed by the formation of passivation layer 25. Finally, a portion of passivation layer 25 overlying metal bond pad 23 is patterned and removed, thereby exposing metal bond pad 23.

Although the present invention is described in various embodiments, it will be apparent to one skilled in the art that changes and modifications may be made thereto without departing from the spirit and scope of the invention as claimed.

I claim:

1. In a process of semiconductor fabrication, forming an opaque film, the forming of said opaque film comprising the steps of:

forming an insulating layer from a co-sputtering of SiN and $SiO_2$; and simultaneously introducing a light blocking pigment into said insulating layer.

2. The process of claim 1, wherein said semiconductor fabrication processes comprise a flat panel display fabrication processes.

3. The process of claim 1, wherein said light blocking pigment comprises a metal oxide.

4. The process of claim 3, wherein said metal oxide is selected from the group consisting of $TiO_2$, $CeO_2$, and $Al_2O_3$.

5. The process of claim 1, wherein said insulating layer is formed prior to a metallization step.

6. The process of claim 1, wherein said insulating layer is formed after a metallization step.

7. The process of claim 1, wherein said insulating layer is patterned simultaneously with a passivation layer.

* * * * *